March 29, 1960 G. M. FORD 2,930,984

STABLE SEMICONDUCTOR AMPLIFIER FOR DIRECT-CURRENT SIGNALS

Filed Aug. 15, 1957

INVENTOR.
GERALD M. FORD

BY [signature]
H. W. Losche [signature]
ATTORNEYS

United States Patent Office 2,930,984

Patented Mar. 29, 1960

2,930,984

STABLE SEMICONDUCTOR AMPLIFIER FOR DIRECT-CURRENT SIGNALS

Gerald M. Ford, Santa Monica, Calif., assignor to the United States of America as represented by the Secretary of the Navy Application August 15, 1957, Serial No. 678,459

3 Claims. (Cl. 330—9)

Figures 1, 2, 3, 4A, 4B, 5:
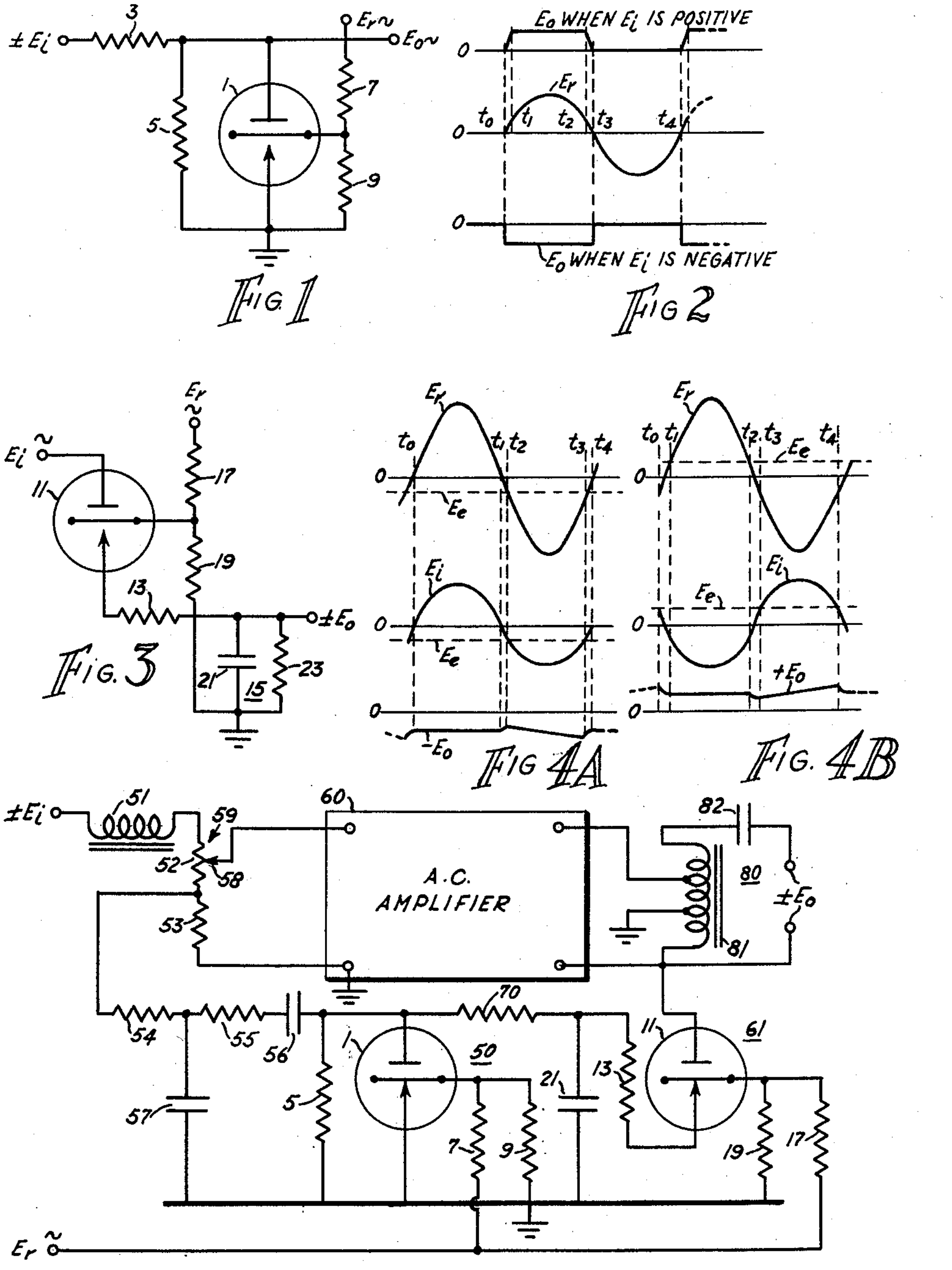

(Granted under Title 35, U.S. Code (1952), sec. 266)

The invention described herein may be manufactured and used by or for the Government of the United States of America for governmental purposes without the payment of any royalties thereon or therefor.

This invention pertains to amplifying systems of the type wherein a direct-current (D.-C.) input signal is chopped to produce an alternating-current (A.-C.) signal which is then amplified and rectified to develop a D.-C. output signal. Such amplifying systems frequently are applied to amplify the low-level error potentials usually encountered in servo-control systems. An important feature of the invention is the use of semiconductors as switching elements in the chopper and synchronous rectifier circuitry. Another important feature of the invention is the use of degenerative feedback between the output signal rectifier and the input signal chopper to increase the stability of the amplifier.

In accordance with this invention a stable semi-conductor amplifier for D.-C. input signals may comprise a chopper operative in response to an A.-C. reference voltage for changing the input signal to an A.-C. output voltage, an A.-C. amplifier for increasing the amplitude of the output voltage, a synchronous rectifier operative in response to the A.-C. reference voltage for changing the amplified A.-C. voltage into a D.-C. output signal, and a degenerative feedback circuit coupled between the synchronous rectifier and the chopper for stabilizing the amplifier.

The novel chopper of this invention may comprise a voltage divider network coupled between a source of D.-C. input signal and a ground source of constant reference potential, a semiconductor switch coupled in parallel with at least a portion of the voltage divider, and a source of A.-C. potential for closing and opening the switch alternately and repetitively, thereby effectively by-passing the parallel-coupled portion of the voltage divider each time the switch is closed such that the unidirectional potential across the switch is caused to fluctuate at the switch-operating frequency. The fluctuating output potential may be changed to an A.-C. voltage by-passing it through a coupling capacitor, thereby eliminating its D.-C. component.

The novel synchronous rectifier of this invention may comprise a semiconductor switch wherein the bidirectionally conductive path of the switch is coupled in series with a resistance-capacitance filter network between a source of A.-C. signal to be rectified and a ground source of constant reference potential. A source of A.-C. reference voltage is applied to the switch to control the opening and closing of the bidirectional path, and the unidirectional output potential is developed across the filter network.

Ordinary practitioners in the art of amplifying D.-C. voltages are well aware of the instabilities and drift tendencies of conventional D.-C. amplifiers. In their effort to improve D.-C. voltage amplification, these practitioners developed apparatus of improved stability and drift characteristics wherein the D.-C. input signal first was changed into an A.-C. voltage, then amplified in a stable, drift-free A.-C. amplifier, and finally converted again into a D.-C. output signal. In such apparatus, the elements utilized for changing the D.-C. input signal into an A.-C. voltage and converting the amplified A.-C. voltage into a D.-C. output signal were electromagnetically-actuated mechanical vibrators, or switches, operated synchronously from a common source of A.-C. reference voltage.

Although the aforedescribed apparatus and technique for increasing the magnitude of D.-C. input signals avoided the effects of drift and instability inherent in conventional D.-C. amplifiers, it soon became evident that use of electromechanical choppers and synchronous rectifiers constituted a source of other serious shortcomings which restricted the field of applicability of such systems. These limitations were attributable to inherent characteristics of the electromechanical choppers and synchronous rectifiers. For example, the inertia of the vibrating element of these units is such that any change in their operating frequency necessarily introduces a corresponding shift in the phase of the output signal, thereby excluding their applicability in systems where the operating frequency is subject to variation. Moreover, electromagnetically-actuated switches also have low reliability factors as the result of mechanical wear and the degeneration of electrical contacts. Thus, amplifying systems wherein electromagnetically-actuated switches are utilized normally are restricted to the operating frequency for which the switches themselves were designed and are uneconomical to operate and maintain inasmuch as the switches must be replaced frequently in order to obtain adequate reliability.

It is a principal object of this invention to eliminate the shortcomings of amplifying systems known heretofore. In the D.-C. amplifying system of this invention the aforestated disadvantages of the prior art system are avoided through the use of semiconductor switching elements in the chopper and synchronous rectifier units. The improvements resulting from the use of such switching elements are attributable, in part, to the fact that semiconductor switches are inherently inertialess and non-mechanical.

In the embodiments of the invention to be described hereinafter the semiconductor switches of the chopper and synchronous rectifier are of the transistor type. As is well understood in the art, a transistor is a semiconductive body having a region of one conductivity type usually sandwiched between two regions of the opposite conductivity type. A large-area metallic connection to the middle region is called the base electrode while similar connections to the end regions are called the emitter and collector electrodes, respectively. A unique characteristic of the transistor which makes it esecially useful for switching purposes is its capacity to conduct current in either direction between the two end regions, depending, of course, upon the polarity of the bias potentials applied thereto. The middle region of the transistor, for example, may function as a switch blade. Thus, when a potential having the polarity normally required to interrupt the conductive path between the emitter and collector is applied to the base of the transistor, and the magnitude of this potential is greater than the magnitude of the greatest potential of the same polarity applied either to the emitter or collector, conduction through the transistor ceases, thereby effectively opening the switch. Conversely, whenever the magnitude of the base potential drops below that of a potential of the same polarity applied to the collector or emitter, or whenever a potential of the opposite polarity is applied to the base, the conduction through the transistor is restored, thereby effectively closing the switch.

An examplary embodiment of a D.-C. amplifier in accordance with this invention may comprise a transistorized chopper coupled to a source of D.-C. input signal of either polarity for changing the D.-C. input signal into an A.-C. voltage; an A.-C. amplifier which, for example, may utilize transistors as amplifying elements; a synchronous rectifier coupled to the output of the A.-C. amplifier for converting the A.-C. output voltage therefrom into a unidirectional output potential having the same polarity as the D.-C. input signal; and means degeneratively coupling a portion of the D.-C. output signal to the transistorized chopper in order to increase the stability of the amplifying system.

An exemplary embodiment of the novel transistorized chopper utilized in this invention may comprise first and second resistors having a common junction, the said first resistor having its end opposite the common junction coupled to a source of D.-C. input signal of either polarity, and the said second resistor having its end opposite the common junction coupled to a ground source of constant potential, such that the first and second resistors constitute a voltage divider; a transistor having a bidirectionally conductive path coupled in parallel across the said second resistor; third and fourth series-connected resistors coupled between a source of A.-C. reference voltage and a ground source of constant potential; and means coupling a point common to the said third and fourth resistors to a conduction-controlling electrode of the transistor.

An exemplary embodiment of the novel transistorized synchronous rectifier utilized in this invention may comprise a transistor having a bidirectionally conductive path coupled in series with a resistance-capacitance filter network between a source of A.-C. voltage and a ground source of constant reference potenial; a voltage divider made up of first and second series-connected resistors coupled between a source of A.-C. reference voltage and the said ground source of constant reference potential; means coupling a point common to the first and second resistors to a current-controlling electrode of the transistor; and an output terminal coupled to the filter network The objects of the invention are as follows:

(1) To provide a stable amplifier for D.-C. signals.

(2) To provide a stable amplifying system of the D.-C. to A.-C. to D.-C. type wherein a D.-C. input signal first is changed to an A.-C. voltage, amplified in an A.-C. amplifier, and then converted to a D.-C. output signal having a greater magnitude and the same polarity as the input signal.

(3) To provide a stable amplifying system of the D.-C. to A.-C. to D.-C. type for amplyfying low-level D.-C. input signals wherein the means for changing the D.-C. input signal to an A.-C. voltage is a chopper and the means for converting the amplified A.-C. voltage into a D.-C. output signal is a synchronous rectifier.

(4) To provide an amplifying system of the D.-C. to A.-C. to D.-C. type for amplifying low-level D.-C. input signals wherein semiconductors switches are utilized in circuitry for effecting the change of the D.-C. input signal to an A.-C. voltage and for effecting the conversion of the amplified A.-C. voltage to a D.-C. output signal.

(5) To provide a stable amplifying system of the D.-C. to A.-C. to D.-C. type wherein the means for changing the input signal into an A.-C. voltage is a novel transistorized chopper, and the means for converting the amplified A.-C. voltage into a D.-C. output signal comprises a novel transistorized synchronous rectifier.

(6) To provide an amplifying system of the D.-C. to A.-C. to D.-C. type for D.-C. input potentials which is stable, free from drifting tendencies, reliable, simple, economical, and light weight.

(7) To provide a stable amplifying system of the D.-C. to A.-C. to D.-C. type wherein a novel transistorized chopper is utilized to change a D.-C. input signal into an A.-C. voltage, a novel transistorized rectifier operated synchronously when the novel chopper converts the amplified A.-C. voltage into a D.-C. output signal, and a degenrative feedback channel is coupled between the novel synchronous restifier and the novel chopper in order to stabilize the amplifying system.

(8) To provide a stable amplifying system as set forth in object (7) wherein the chopper comprises a transistor having a bidirectionally conductive path coupled in parallel with a portion of a voltage divider coupled across the source of the D.-C. input signal, and a source of A.-C. reference voltage coupled to a current-controlling electrode of the transistor such that the bidirectionally conductive path is interrupted and closed alternately at the frequency of the A.-C. reference voltage.

(9) To provide a stable amplifying system as set forth in object (7) wherein the transistorized rectifier comprises a transistor having a bidirectionally conductive path coupled in series with a resistance-capacitance filter network between a source of A.-C. input voltage and a source of constant ground potential, a source of A.-C. reference voltage coupled to the conductivity-controlling electrode of the transistor, and means for deriving a unidirectional output signal from the filter network.

(10) To provide apparatus of superior economy and engineering simplicity for effecting any of the aforesaid objects.

The foregoing summary of the invention, discussion of the problems evoking its origination, and statement of its objects are intended merely to develop an understanding and appreciation of its principal features, not to restrict its scope. It is probable that additional objects and features of the invention will become apparent after reference to the following detailed description made in conjunction with the accompanying drawings wherein:

Fig. 1 represents an embodiment of the novel chopper of this invention,

Fig. 2 represents reference voltage and output waveforms for the embodiment of Fig. 1, Fig. 3 represents an embodiment of a novel synchronous rectifier as utilized in the invention, Fig. 4A represents reference voltage, input voltage, and D.-C. output potential fluctuations for the embodiment of Fig. 3 when the waves of the reference voltage $E_r$ and the waves of the input voltage $E_i$ are in phase, Fig. 4B represents the reference voltage, input voltage, and output voltage variations for the embodiment of Fig. 3 at a time when the waves of the reference voltage $E_r$ and input voltage $E_i$ are one hundred eighty degrees out of phase, and Fig. 5 represents an embodiment of a stable semiconductor amplifying system in accordance with this invention.

The embodiment of the novel chopper represented in Fig. 1 comprises a transistor 1 of the P-N-P type having its collector electrode coupled to a point common to series-connected resistors 3 and 5, its emitter electrode coupled to a ground source of constant potential, and its base electrode coupled to a point common to series-connected resistors 7 and 9. The series-connected resistors 3 and 5 form a first voltage divider between a source of D.-C. input signal $\pm E_i$ and a ground source of constant reference potential, and series-connected resistors 7 and 9 form a second voltage divider between a source of A.-C. reference voltage $E_r$ and the ground source of constant potential. The output voltage $E_o$ fluctuating at the frequency of A.-C. reference voltage $E_r$ is derived from the collector electrode of transistor 1.

The transistor 1 functions as a switch in response to the portion of the A.-C. reference voltage tapped from the voltage divider 7—9 and applied to its base electrode. As represented in Fig. 2, the transistor switch 1 is open during positive half cycles of the A.-C. reference voltage $E_r$ and is closed during negative half cycles. Assume first that the D.-C. input signal $E_i$ is positive. When this condition exists, the output signal $E_o$, represented by the upper waveform of Fig. 2, has sloping sides, indicating that transistor switch 1 is closed during the initial and ending portions of the positive half cycles of A.-C. reference voltage $E_r$. At time $t_0$, the A.-C. reference voltage $E_r$ is beginning a positive half cycle and the transistor switch 1 closes, causing the positive input signal $E_i$ to establish a positive potential at the collector electrode. As a result, electron current sufficient to reduce the potential on the collector electrode to that of the emitter flows in the inverse direction through transistor switch 1. When this condition exists, the output signal $E_o$ remains constant. Consequently, the collector potential does not begin to change until the rising positive potential of $E_r$ begins to attenuate the flow of electron current through the transistor switch 1.

As represented in Fig. 2, the effect of the rise of reference voltage $E_r$ during the time interval $t_0$ to $t_1$ is to attenuate the flow of electron current through transistor switch 1 such that a corresponding rise in potential occurs on its collector electrode. At time $t_1$ the amplitude of the positive half cycle of $E_r$ becomes great enough to cause transistor switch 1 to open, thereby disrupting the flow of electron current therethrough. The transistor switch 1 remains open during the time interval $t_1$ to $t_2$. During this interval the output voltage $E_o$ remains at the magnitude established by the voltage divider 3—5 coupled between the source of D.-C. input signal $+E_i$ and the ground source of constant potential.

At time $t_2$ the amplitude of A.-C. reference voltage $E_r$ again has become less positive than the potential present on the collector electrode, such that electron current once more begins to flow from the emitter to the collector. As reference voltage $E_r$ diminishes during time interval $t_2$ to $t_3$, the flow of electron current increases until, at time $t_3$, its magnitude has become great enough to make the potential on the collector electrode equal to that of the ground source of constant reference potential applied to the emitter electrode. At this instant, the output signal $E_o$ reaches its minimum level.

During the time interval $t_3$ to $t_4$ the negative half cycle of $E_r$ is present on the base electrode of transistor switch 1, the switch remains in its closed condition, a constant flow of electron current is passing therethrough in the inverse direction, and the magnitude of the output signal $E_o$ remains constant at its minimum value. At time $t_4$ another positive half cycle reference voltage $E_r$ begins and the cycle is repeated.

When the polarity of the D.-C. input signal $E_i$ is negative, the waveform of the resulting A.-C. output signal $E_o$ is represented in the lower curve of Fig. 2. At time $t_0$ a positive half cycle of A.-C. reference voltage $E_r$ begins, causing transistor switch 1 to open abruptly. During the entire positive half cycle of $E_r$ the transistor switch 1 remains open and no electron current flows therethrough. Accordingly, the magnitude of the negative output signal $E_o$ is estabilshed by the magnitude of the D.-C. input signal $-E_i$ and the voltage divider 3—5 across which it is coupled.

At time $t_3$ a negative half cycle of A.-C. reference voltage $E_r$ begins. Inasmuch as the potential present on the collector electrode of transistor switch 1 is negative at this instant, the effect of the negative-going voltage derived from $E_r$ and applied to the base electrode of transistor 1 is to cause the switch to close abruptly, thereby initiating electron current flow in the normal direction from collector to emitter. This flow of electrons abruptly causes the potential on the collector electrode to rise to the level of that present on the emitter elecrode. Inasmuch as emitter and collector potentials are equal, no further increase in electron current flow occurs and the magnitude of the output signal $E_o$ remains constant at the zero level until the negative half cycle ends at time $t_4$. At this instant another positive half cycle of $E_r$ begins and the aforedescribed cycle of operation is repeated.

In the aforedescribed manner, the output signal $E_o$ is caused to fluctuate between maximum and minimum levels. In an application where an A.-C. output signal is desired, a coupling capacitor may be utilized to eliminate the D.-C. component of the fluctuating potential developed on the collector electrode of transistor switch 1.

Although the transistor 1, represented in Fig. 1, is of the P-N-P type, it should be noticed that a transistor of the N-P-N type could be used equally well. The principal effect of using a transistor of the latter type would be to cause switching action during the positive half cycles of reference voltage $E_r$ instead of negative half cycles. Notwithstanding the type utilized, a transistor will function effectively as an electron switch if coupled in the common collector configuration instead of the common emitter configuration as shown in Fig. 1.

The embodiment of the novel synchronous rectifier, Fig. 3, comprises a transistor 11 of the P-N-P type having its collector electrode coupled to a source of A.-C. input signal $E_i$, its emitter coupled through a resistor 13 and the resistance-capacitance filter network 15 to a ground source of constant reference potential, and its base electrode coupled to a point common to series-connected resistors 17 and 19. The series-connected resistors 17 and 19 form a voltage divider between a source of A.-C. reference voltage $E_r$ and a ground source of constant potential. The resistance-capacitance network 15 comprises capacitor 21 and resistor 23 coupled in parallel. The D.-C. output signal $\pm E_o$ is taken from a point common to resistor 13 and the filter network 15.

The input and output signal waveforms for two conditions of operation of the synchronous rectifier of Fig. 3 are represented in Fig. 4A and Fig. 4B. As shown in Fig. 4A, a D.-C. output signal $E_o$ of negative polarity is produced when the A.-C. input signal $E_i$ is in phase with the A.-C. reference voltage $E_r$. On the other hand, when the A.-C. input signal is out of phase with the A.-C. reference voltage $E_r$, a D.-C. output signal $E_o$ of positive polarity is produced. The waveforms for the latter are represented in Fig. 4B. It should be noted that the A.-C. input signal $E_i$ always will be in phase, or one hundred eighty degrees out of phase, with the A.-C. reference voltage $E_r$. This is true because the A.-C. input signal $E_i$ normally will be produced by a chopper which also operates in response to the A.-C. reference voltage $E_r$. In a chopper such as that represented in Fig. 1, for example, the output signal $E_o$ will be in phase with the A.-C. reference voltage $E_r$ whenever the D.-C. input signal to the chopper is of positive polarity, and will be one hundred eighty degrees out of phase with the A.-C. reference voltage $E_r$ whenever the D.-C. input potential $E_i$ is of negative polarity. Thus, only two possible phase relationships between the A.-C. reference voltage and a chopper output signal can exist, a first relationship wherein $E_r$ and $E_o$ are in phase, and a second relationship wherein $E_r$ and $E_o$ are exactly one hundred eighty degrees out of phase. In a synchronous rectifier such as that of Fig. 3 the output signal $E_o$ of a chopper which, for example, may be similar to that represented in Fig. 1, becomes the input signal $E_i$ supplied to the input terminal of the rectifier and the A.-C. reference voltage $E_r$ is derived from the same source as that supplied to the chopper.

Consider the operation of the synchronous rectifier of Fig. 3, as shown in Fig. 4A, when the A.-C. input signal $E_i$ is in phase with the A.-C. reference voltage $E_r$. Assume that the filter capacitor 21 is charged to a magnitude slightly less than that of the maximum amplitude of the negative half cycle of A.-C. input signal $E_i$, and that the maximum amplitudes of the A.-C. reference voltage $E_r$ are greater than the corresponding maxima of the A.-C. input signal $E_i$. As shown in Fig. 4A, both $E_i$ and $E_r$ begin positive half cycles at time $t_0$. During the entire positive half cycle the potential applied to the base electrode of transistor switch 11 always is biased positive with respect to the potentials present in the emitter and collector electrodes and, as a result, transistor switch 11 is open; current cannot flow between the emitter and collector electrodes in either direction, and the D.-C. output signal $-E_o$ remains constant, as shown in the bottom curve of Fig. 4A.

At time $t_1$ the negative half cycles of $E_r$ and $E_i$ begin. At this instant a negative potential exists on the emitter electrode of transistor switch 11 on account of the negative charge stored on the upper plate of filter capacitor 21. The magnitude of this negative potential is represented approximately, for explanatory purposes, by the horizontal dotted lines $E_e$ of Fig. 4A. As $E_r$ and $E_i$ become more negative during the interval between $t_1$ and $t_2$, the potential relationships on the electrodes of transistor switch 11 are such that electron current flows in the inverse direction, from emitter to collector, thereby partially discharging filter capacitor 21 through resistor 13. The discharge of filter capacitor 21 is represented by the slight rise in the waveform of the D.-C. output signal $-E_o$, shown in Fig. 4A between $t_1$ and $t_2$. The inverse flow of electron current through transistor switch 11 occurs because the potential $E_r$ on the base electrode becomes negative more rapidly than the potential $E_i$ on the collector electrode, and the pre-existing potential on the emitter electrode, established by the charge remaining in capacitor 21, is more negative than either $E_r$ or $E_i$. As a result, the collector electrode is positive relative to the emitter electrode, and electron current flows from emitter to collector.

When, at time $t_2$, the amplitude of $E_i$ becomes equal to the magnitude of the pre-existing negative potential on the emitter, the collector electrode becomes relatively more positive than the emitter electrode and electron current begins to flow in the normal direction from collector to emitter, thereby again charging filter capacitor 21 and causing the magnitude of D.-C. output signal $-E_o$ to become more negative, as represented between times $t_2$ and $t_3$ in the lower waveform of Fig. 4A.

At time $t_3$ the amplitude of the negative half cycle of $E_i$ has diminished to the level where the potential on the emitter electrode of transistor switch 11 is once again more negative than that applied to the collector electrode, and inverse electron current through the switch again discharges filter capacitor 21. The discharge continues until a new positive half cycle is initiated at time $t_4$. At this instant a new cycle operation of the synchronous rectifier begins and proceeds in the manner just described.

The voltage relationship of the synchronous rectifier of Fig. 3 when $E_r$ and $E_i$ are out of phase is represented in Fig. 4B. Under this condition of operation, the synchronous rectifier produces a D.-C. output signal $E_o$ of positive polarity. As before, assume that the filter capacitor 21 has a positive charge on its upper plate slightly less than the maximum positive amplitude of the A.-C. input signal $E_i$ and that the maximum amplitudes of the A.-C. reference voltage $E_r$ are greater than those of $E_i$. The latent positive charge on filter capacitor 21 establishes a positive potential $E_e$ on the emitter electrode of transistor switch 11, approximated, for explanatory purposes, by the horizontal dotted lines of Fig. 4B.

During the time interval $t_0$ to $t_1$, the A.-C. input signal $E_i$ is negative-going, thereby establishing a potential on the collector which is relatively more negative than the potential $E_e$ on the emitter of transistor 11. As a result, electron current flows in the normal direction from collector to emitter and partially discharges the positive potential on the upper plate of filter capacitor 21, an effect represented in the bottom waveform of Fig. 4B. This discharging current continues until, at time $t_1$, the positive potential established on the base electrode of the transistor 11 by the positive-going swing of A.-C. reference voltage $E_r$ becomes equal to the emitter potential $E_e$, thereby causing the cessation of electron current flow by the opening of switch 11.

During the time interval $t_1$ to $t_2$ the positive swing of A.-C. reference voltage $E_r$ maintains transistor switch 11 in its open position and the D.-C. output signal $+E_o$ remains constant, as shown in the lower waveform of Fig. 4B.

At time $t_2$, $E_r$ on its negative-going downswing once more becomes relatively negative with respect to the emitter potential $E_e$. As a result, the switch is closed and electron current again flows in the normal direction from collector to emitter, thereby causing still further discharge of filter capacitor 21. At time $t_3$ the collector potential established by the A.-C. input signal $E_i$ begins to become more positive than the emitter potential $E_e$ established by the latent charge on filter capacitor 21 and the switch, remaining closed on account of the negative swing of the potential on the base electrode established by A.-C. reference potential $E_r$, begins to pass electron current in the inverse direction, from emitter to collector, thereby increasing the positive charge on the upper plate of filter capacitor 21 and causing the D.-C. output signal $+E_o$ to become more positive, as shown in the lower waveform of Fig. 4B.

At time $t_4$, the potential of the emitter and collector electrodes of the transistor switch again reverses, causing electron current to flow in the normal direction and again discharging filter capacitor 21 in the manner described above for the time interval $t_0$ to $t_1$. Thus, the synchronous rectifier begins a new cycle of operation similar to the one just described.

Although the transistor 11 represented in the embodiment of Fig. 3 is of the P-N-P type, it should be apparent that transistors of the N-P-N type also may be used in lieu thereof. However, the use of a transistor of the N-P-N type will reverse the polarity of the D.-C. output signal. It should be noticed that satisfactory results may be obtained by reversing the emitter and collector connections shown in Fig. 3, notwithstanding the type of transistor utilized therein.

The embodiment of the stable semiconductor amplifier for D.-C. input signals represented in Fig. 5 comprises a novel chopper 50 of the kind represented in Fig. 1 for changing a D.-C. input signal $\pm E_i$ into an A.-C. voltage having a phase and amplitude representing the polarity and magnitude of $E_i$; an A.-C. amplifier 60 for increasing the amplitude of the A.-C. voltage; a synchronous rectifier 61 for converting the amplified A.-C. voltage into a D.-C. output signal $E_o$ having the same polarity as input signal $E_i$; and a degenerative feedback channel 70 coupled between synchronous rectifier 61 and chopper 50 to increase the stability of the amplifying system. A choke coil 51, coupled in series with a voltage divider made up of potentiometer resistor 52 and resistor 53, effectively eliminates any high frequency A.-C. components which may be present in the D.-C. input signal $\pm E_i$. A portion of the D.-C. input potential $\pm E_i$ developed across resistor 53, passes via resistors 54 and 55 and coupling capacitor 56 to the chopper 50.

The chopper 50 is similar in structure and operation to the chopper represented in Fig. 1. For this reason, the same reference numerals are used for similar elements on both figures. Thus, chopper 50 comprises a transistor of the P-N-P type coupled in parallel across resistor 5, and having a portion of an A.-C. reference voltage derived from a point common to series-connected resistors 7 and 9 coupled to its base electrode. A filter capacitor 57 is coupled between a point common to resistors 54 and 55 and a ground source of constant reference potential in order to round off the corners of the output voltage wave developed by chopper 50. The coupling capacitor 56 eliminates the D.-C. component from the output signal of chopper 50 and the A.-C. output voltage from chopper 50 is supplied to A.-C. amplifier 60 via the wiper arm 58 of potentiometer 59.

The A.-C. voltage from chopper 50 is then amplified in A.-C. amplifier 60. Although this amplifier may be comprised of any conventional apparatus for increasing the amplitude of an A.-C. voltage, the form preferred for use in the embodiment of Fig. 5 is a transistorized push-pull circuit having its stages intercoupled electromagnetically and tuned to the frequency of the A.-C. output voltage of chopper 50. After amplification, the A.-C. voltage is converted by synchronous rectifier 61 into a D.-C. output signal of greater magnitude than, but having the same polarity as, the D.-C. input signal $E_i$.

The synchronous rectifier 61 is similar in structure and operation to that represented in Fig. 3 and, for this reason, the same reference numerals are used for the common elements of both. Thus, the synchronous rectifier 61 may comprise a transistor of the P-N-P type having its collector-to-emitter path coupled in series with resistor 13 and charging capacitor 21 between the output terminal of A.-C. amplifier 60 and a ground source of constant reference potential. A portion of A.-C. reference voltage $E_r$ developed across resistor 19 of voltage divider 17—19 is applied to the base electrode of transistor 11. Inasmuch as the base electrodes of transistor 1 and transistor 11 of the chopper and synchronous rectifier, respectively, are coupled to a common source of A.-C. reference voltage $E_r$, the switching operation of transistor 11 is synchronized with that of transistor 1.

After rectification in synchronous rectifier 61, the resulting D.-C. signal is smoothed by output circuit 80 comprised of filter choke 81 and capacitor 82. The D.-C. output signal $\pm E_o$ is developed across the terminals of output circuit 80.

A degenerative feedback potential developed on the upper plate of capacitor 21 is supplied degeneratively via resistor 70 to chopper 50 in order to stabilize the amplifier more effectively. The values of capacitor 21 and resistor 70 should be chosen so that the resulting R–C time constant is long enough to render the feedback channel substantially unresponsive to transients which may occur in the D.-C. input signal $\pm E_i$.

The details illustrated in the accompanying drawings and set forth in the foregoing description are intended merely to facilitate the practice of the invention by persons skilled in the art. The scope of the invention is represented in the following claims.

What is claimed is:

1. A stable semiconductor amplifier for direct-current input signals comprising: amplifying means for amplifying an alternating-current voltage to produce an amplified voltage; a chopper for changing the direct-current input signals into said alternating-current voltage, said chopper having a transistor with its emitter-collector path coupled between said amplifying means and a ground source of constant reference potential for varying the effective input impedance of said amplifying means, and having a base coupled to an input for an alternating-current control potential for actuating said transistor periodically such that the direct-current input signals to the said amplifying means are changed into said alternating-current voltage; a synchronous rectifier coupled to said amplifying means for converting the said amplified voltage into direct-current output signals of said amplifier having the same polarity as that of the said input signals, said synchronous rectifier having a transistor switch coupled between the output of said amplifying means and said ground source of constant reference potential and means coupling said switch to the said input for alternating-current control potential for synchronization such that the half cycles of at least one of the two polarities of the voltage output of the said amplifying means effectively are bypassed to the ground source of constant reference potential; and means intercoupling said chopper and said synchronous rectifier for degeneratively supplying a portion of the said direct-current output signals to the said chopper, thereby effectively stabilizing the amplifier.

2. A stable semiconductor amplifier for direct-current input signals comprising: amplifying means for amplifying an alternating-current voltage to produce an amplified voltage; a chopper for changing the direct-current input signals into said alternating-current voltage, said chopper having a single transistor with its emitter-collector path coupled between said amplifying means and a ground source of constant reference potential and with its base coupled to an input for an alternating-current control potential of magnitude sufficient to actuate said transistor periodically such that the direct-current input signals to the said amplifying means are changed into an alternating-current voltage regardless of their polarity by varying the effective input impedance of said amplifying means; a synchronous rectifier coupled to said amplifying means for converting the said amplified voltage into direct-current output signals of said amplifier having the same polarity as that of the said input signals, said synchronous rectifier having a single transistor switch with its emitter-collector path coupled between the output of said amplifying means and said ground source of constant reference potential and its base coupled to said input for alternating-current control potential, for synchronization such that the half cycles of at least one of the two polarities of the voltage output of the said amplifying means effectively are bypassed to the ground source of constant reference potential; and means intercoupling said chopper and said synchronous rectifier for degeneratively supplying a portion of the said direct-current output signals to the said chopper, thereby effectively stabilizing the amplifier.

3. A stable semiconductor amplifier for direct-current input signals as represented in claim 2 wherein the said amplifying means comprises at least one push-pull semiconductor amplifying stage tuned to the frequency of the said alternating-current voltage.

References Cited in the file of this patent

UNITED STATES PATENTS

| | | |
|---|---|---|
| 2,685,000 | Vance | July 27, 1954 |
| 2,693,568 | Chase | Nov. 2, 1954 |
| 2,714,136 | Greenwood | July 26, 1955 |
| 2,744,168 | Gilbert | May 1, 1956 |
| 2,796,578 | Barnes | June 18, 1957 |
| 2,801,296 | Blecher | July 30, 1957 |
| 2,846,586 | Jernakoff | Aug. 5, 1958 |

FOREIGN PATENTS

| | | |
|---|---|---|
| 903,698 | Germany | Feb. 8, 1954 |